United States Patent [19]
Ahn et al.

[11] Patent Number: 5,774,499
[45] Date of Patent: Jun. 30, 1998

[54] SIGNAL DEMODULATION METHOD AND APPARATUS THEREFOR USING MULTI-ARY SAMPLING

[75] Inventors: Young Bok Ahn; Weon-hee Cho, both of Seoul, Rep. of Korea

[73] Assignee: Medison Co., Ltd., Rep. of Korea

[21] Appl. No.: 418,569

[22] Filed: Apr. 7, 1995

[51] Int. Cl.$^6$ .................................. H04L 5/12; A61B 8/00
[52] U.S. Cl. .......................... 375/261; 375/328; 375/349; 367/7; 128/661.01; 73/602; 73/625
[58] Field of Search ..................................... 375/260, 261, 375/324, 328, 340, 344, 349, 350, 371; 367/7, 11, 103, 124, 126; 348/537, 538; 73/602, 625, 626; 128/661.01; 324/76.77, 76.78, 76.82

[56] References Cited

U.S. PATENT DOCUMENTS 5,581,036  12/1996  Chang et al. .............................. 73/602
5,600,675   2/1997  Engeler .................................... 375/261

*Primary Examiner*—Stephen Chin
*Assistant Examiner*—Amanda T. Le
*Attorney, Agent, or Firm*—Dilworth & Barrese

[57] ABSTRACT

A signal demodulation apparatus using a multi-ary sampling for beam formation of a received signal reduces a difference between a sampling point of time of an in-phase signal and a sampling point of time of a quadrature signal due to an existing secondary sampling method. Each of a plurality of analog-to-digital converters produces a first in-phase signal and at least two first quadrature signals adjacent to the first in-phase by sampling each input signal input via a plurality of channels at a sampling point of time having a sampling period of the input signal and other sampling points of time having a sampling interval smaller than the sampling period of the input signal. A quadrature component calculator of each channel produces second quadrature signals in which an error due to a difference between the sampling point of time of the first in-phase signal and the sampling points of time of the first quadrature signal is reduced. A first accumulator accumulates first in-phase signals of all the channels to produce a second in-phase signal and a second accumulator accumulates second quadrature signals of all the channels to produce a third quadrature signal. The second in-phase signal and the third quadrature signal are used for detection of an envelope signal of the received signal. The apparatus can be used in a sonar and a radar as well as an ultrasonic image apparatus, rendering an effect capable of obtaining an in-phase signal and a quadrature signal from which an error due to a difference between sampling points of time is remarkably reduced compared with the existing secondary sampling method.

21 Claims, 13 Drawing Sheets

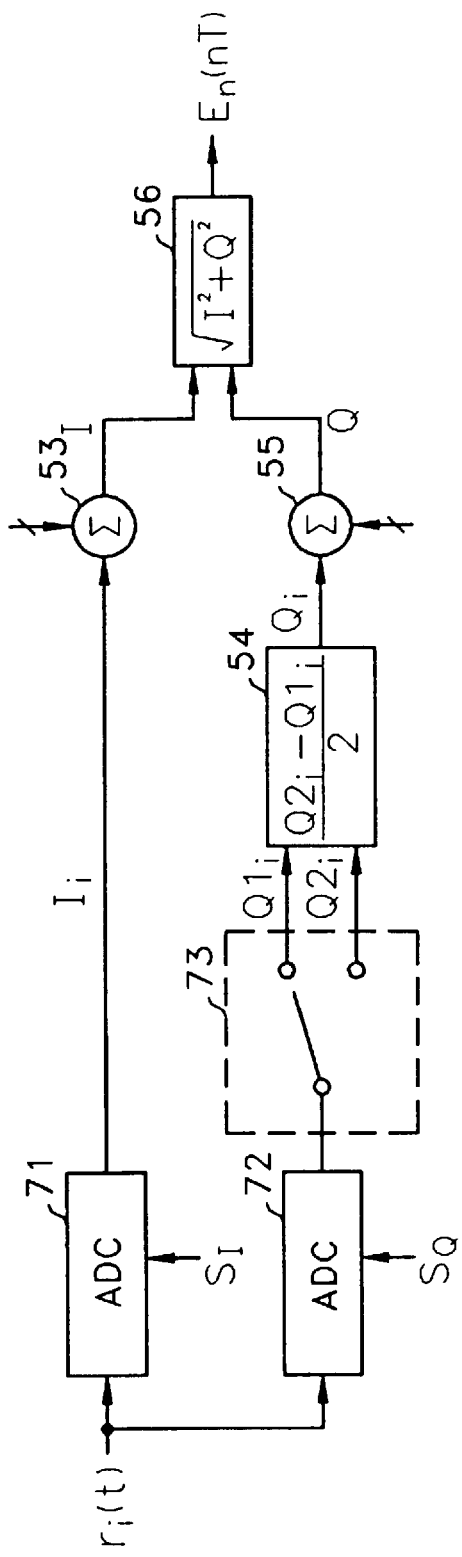
FIG. 7A
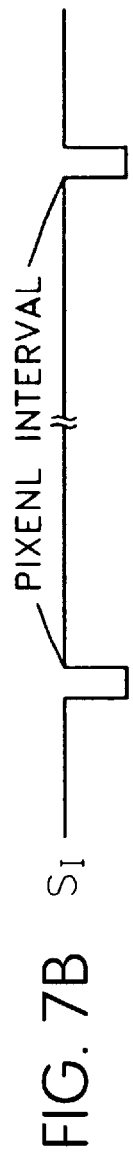
FIG. 7B $S_I$
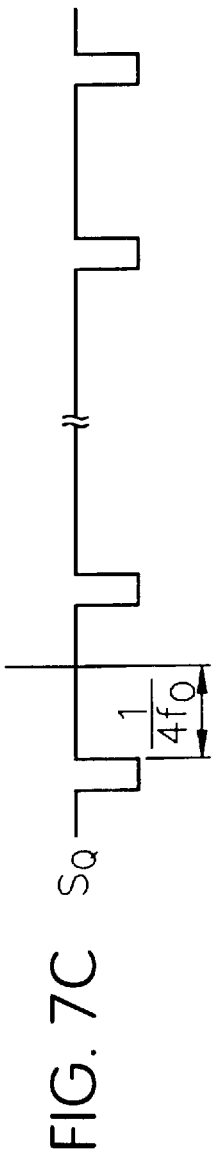
FIG. 7C $S_Q$

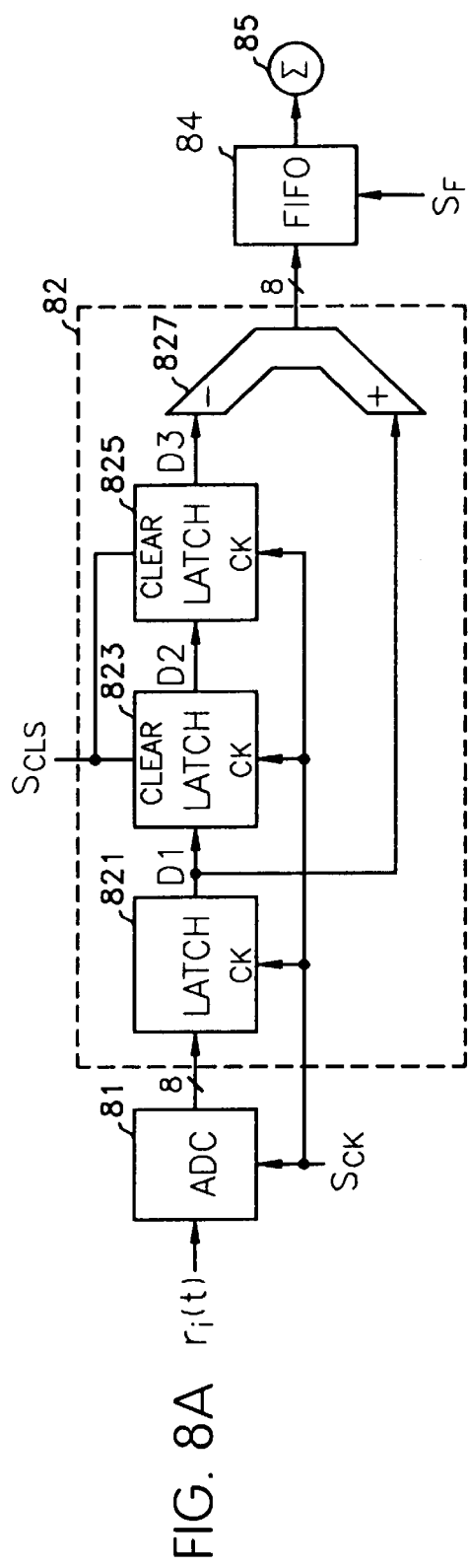
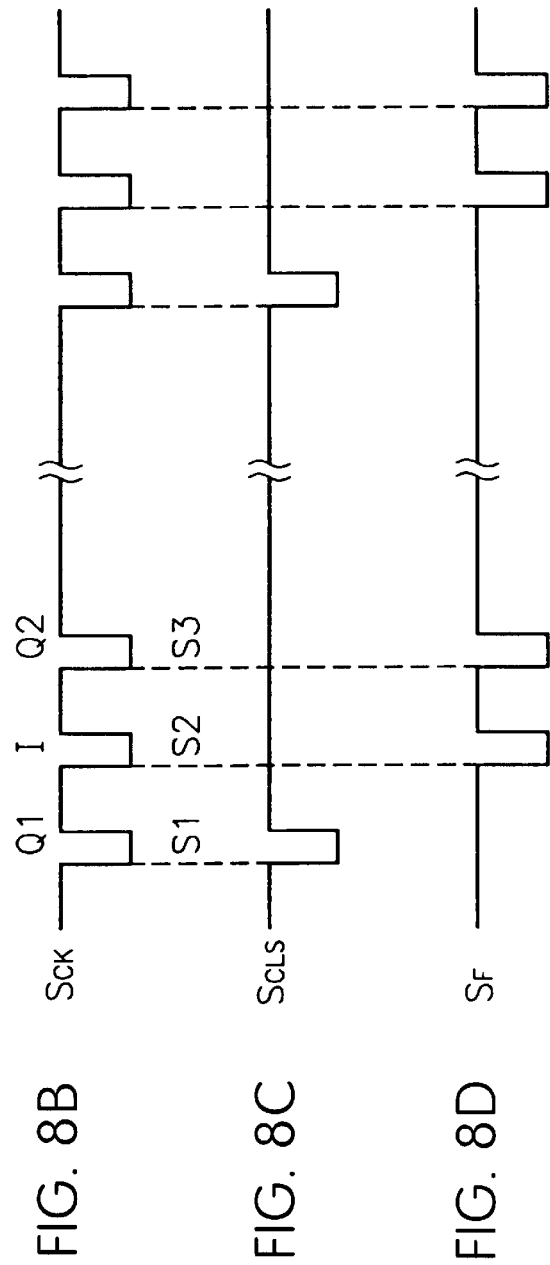
FIG. 8A
FIG. 8B
FIG. 8C
FIG. 8D

SIGNAL DEMODULATION METHOD AND APPARATUS THEREFOR USING MULTI-ARY SAMPLING

BACKGROUND OF THE INVENTION

The present invention relates to a signal demodulation technology of using a multi-ary sampling technique, and more particularly to a signal demodulation method and apparatus thereof using a multi-ary sampling technique so as to generate an in-phase signal and a quadrature signal corresponding to the in-phase signal from an input signal.

There is a system for digital beam forming as an example of a system which uses an in-phase signal and a quadrature signal obtained from an input signal. A sonar, or an ultrasonic video equipment which uses a digital beam forming technology receives a signal reflected from a scattered particle or an interface via a sensor array, and detects an envelope from the received signal, so as to obtain image information with respect to a desired object.

In case of an ultrasonic image apparatus which is used as a medical diagnostic unit, a sequential dynamic focusing and steering technique is used for improving resolution of the image. The dynamic focusing technique at a reception mode uses signals which are received via each array element in a transducer array or a channel, properly delayed and added to each other to obtain the optimal resolution with respect to all image points. A lateral resolution which is one of the crucial factors which determines a quality of an ultrasonic image is determined by focusing an ultrasonic beam. For better focusing, the number of the elements in the transducer array or the channels should be increased.

A reactor-capacitor (LC) delay circuit has been used for properly delaying the received signal in the conventional analog ultrasonic image system. However, in this system, a very complicated switching circuit is required in order to obtain a focusing pattern with respect to a desired point and a delay pattern with respect to a steering direction, respectively. Accordingly, a problem has been exposed which increases a total volume of the system. Moreover, it is economically difficult to realize an LC delay circuit with a degree of precision which is required for the sequential dynamic focusing and steering.

A method for accomplishing the sequential dynamic focusing and steering by using a digital technology is being recently spot-lighted. The reason is due to a fact that if the digital technology is used, a delay time for reception can be adjusted exacter and faster, and accordingly a necessary reflected signal can be followed even with respect to any steering directions.

Generally, in case of a digital ultrasonic image system, the signals which are reflected and received from the respective array elements are sampled and stored as digital data. The stored digital data is time delayed and added for obtaining an image of a desired point. Since an entire signal process for an ultrasonic image can be digitized by using such a digital beam forming technology, an ultrasonic image apparatus can be realized simply without having an LC delay circuit. The most important factor in embodying the digital beam forming technology is finding a sampling method which causes generation of an extremely small error for ignorance and can be realized with simple hardware to obtain an envelope of the received signal. Particularly, since an identical sampling circuit is used in each element of the transducer array, it is very important to reduce an amount of the hardware of the necessary sampling circuit by the number of the array elements. Meanwhile, a wide-band digital circuit and a large number of the digital memories are required when a sampling frequency is high. Thus, to lower the sampling frequency, a bandwidth sampling method such as a quadrature sampling method, an analytic-signal sampling method or a secondary sampling method is used. The quadrature sampling and analytic-signal sampling method are not easy for application into the ultrasonic image system because of difficulty of the embodiment thereof. On the contrary, the secondary sampling method has been proposed as the most appropriate sampling method for embodying a digital beamforing technology because of an advantage of very simply embodying the secondary sampling method with only a digital circuit. Although the secondary sampling method for sampling the received signal at a different sampling time to obtain an in-phase signal and a quadrature signal can be embodied very simply with only a digital circuit, an application for an ultrasonic image apparatus requiring a wide-bandwidth of the received signal causes generation of the many errors when detecting an envelope.

SUMMARY OF THE INVENTION

Therefore, to solve the above problems, it is a first object of the present invention to provide a signal demodulation method using a multi-ary sampling capable of greatly reducing errors which are generated in a secondary sampling method while maintaining various merits of the secondary sampling method.

It is a second object of the present invention to provide a signal demodulation method using a multi-ary sampling in which an in-phase signal and a quadrature signals obtained with respect to all the channels are separately accumulated, thereby detecting an envelope signal for beam forming by using the accumulated in-phase signal and the accumulated quadrature signal.

It is a third object of the present invention to provide a signal demodulation method using a multi-ary sampling in which an in-phase signal and a quadrature signal obtained with respect to each channel are separately accumulated, and a new quadrature signal having a reduced error due to a difference between sampling points of time is produced, thereby detecting an envelope signal for beam forming by using the accumulated in-phase signal and the new quadrature signal.

It is a fourth object of the present invention to provide a signal demodulation apparatus using a multi-ary sampling for beam forming of received signals.

Thus, to accomplish the above first object of the present invention, there is provided a signal demodulation method using a multi-ary sampling comprising the steps of:

(a) producing an first phase signal and at least two second phase signals adjacent to the first phase signal by sampling an input signal at a sampling point of time having a sampling period of the input signal and other sampling points of time having a sampling interval smaller than the sampling period of the input signal; and (b) generating a corresponding second phase signal in which the second phase signals produced in the step (a) are received for reducing an error due to a difference between the sampling point of time of the first phase signal and the sampling points of time of the second phase signals.

To accomplish the above second object of the present invention, there is provided a signal demodulation method using a multi-ary sampling comprising:

a first step for producing a in-phase signal and at least two quadrature signals adjacent to the in-phase signal by sampling each input signal input via a plurality of channels at a sampling point of time having a sampling period of the input signal and other sampling points of time having a sampling interval smaller than the sampling period of the input signal, the sampling period of the input signal being set each channel; and a second step for generating a corresponding quadrature signal each channel in which an error due to a difference between the sampling point of time of the in-phase signal and the sampling points of time of the quadrature signal is reduced from the quadrature signals produced in the first step;

a third step for producing an accumulated in-phase signal and an accumulated corresponding quadrature signal by accumulating the in-phase signals and the corresponding quadrature signals produced in the first and second steps by a same phase signal; and a fourth step for detecting an envelope signal for beam forming of the input signal by receiving the accumulated in-phase signal and the accumulated corresponding quadrature signal.

To accomplish the above third object of the present invention, there is provided a signal demodulation method using a multi-ary sampling comprising:

a first step for producing a first in-phase signal and at least two first quadrature signals adjacent to the first in-phase signal by sampling each input signal input via a plurality of channels at a sampling point of time having a sampling period of the input signal and other sampling points of time having a sampling interval smaller than the sampling period of the input signal, the sampling period of the input signal being set each channel; and a second step for producing a second in-phase signal and second quadrature signals by receiving and accumulating the first in-phase signals and the first quadrature signals produced in the first step by a mutually related phase signal according to an order produced in the first step;

a third step for for producing a third quadrature signal in which the second quadrature signals produced in the second step are received and an error due to a difference between the sampling point of time of the first in-phase signal and the sampling points of time of the first quadrature signal is reduced in each channel of the first step;

a fourth step for detecting an envelope signal for beam forming by receiving the second in-phase signal and the third quadrature signal.

To accomplish the above fourth object of the present invention, there is provided a signal demodulation apparatus using a multi-ary sampling for beam forming of an input signal comprising:

first means for producing a first in-phase signal and at least two first quadrature signals adjacent to the first in-phase signal by sampling each input signal input via a plurality of channels at a sampling point of time having a sampling period of the input signal and other sampling points of time having a sampling interval smaller than the sampling period of the input signal, the sampling period of the input signal being set each channel; and a second means for producing a second in-phase signal and second quadrature signal accumulated with respect to all the channels by receiving the first in-phase signals and the first quadrature signals produced in the first means and an error due to a difference between the sampling point of time of the first in-phase signal and the sampling points of time of the first quadrature signals is reduced;

third means for detecting an envelope signal for beam forming of the received signal by receiving the second in-phase signal and the second quadrature signal produced in the second means.

A signal demodulation apparatus of an input signal using a ternary sampling comprising:

an analog-to-digital converter for sampling the input signal at a first sampling point of time having a sampling period of the input signal and two second sampling points of time having a sampling interval smaller than the sampling period of the input signal and temporally adjacent to the first sampling point of time;

a first latch for latching the output signal from the analog-to-digital converter according to a sampling signal;

a second latch for latching the output signal of the first latch according to the sampling signal and which is cleared by a clear signal synchronized at the earliest sampling point of time among the three sampling points of time;

a third latch for latching the output signal of the second latch according to the sampling signal and which is cleared by the clear signal; and a subtracter which is constructed to receive the output signal of the first latch as an adding input end and the output signal of the third latch as a subtracting input end, wherein the subtracter outputs a latched signal as it is when a first signal and a second signal among three signals generated by the sampling signal are latched in the first latch, and subtracts the output signal of the third latch from the output signal of the first latch when a third signal is latched to the first latch and divides the signal produced by the subtraction result by two, to thereby generate a fourth signal.

BRIEF DESCRIPTION OF THE DRAWINGS

FIG. 7A is a circuit diagram of a digital beam forming apparatus using a multi-ary sampling method according to a third embodiment of the present invention.

FIGS. 7B and 7C are waveform diagrams showing sampling clocks which are used in analog-to-digital converters 71 and 72 of the FIG. 7A apparatus, respectively.

FIG. 8A is a circuit diagram of a digital beam forming apparatus using a multi-ary sampling method according to a fourth embodiment of the present invention.

FIGS. 8B through 8D are timing diagrams showing clocks which are used in the FIG. 8A apparatus.

DETAILED DESCRIPTION OF THE PREFERRED EMBODIMENT

Preferred embodiments according to a signal demodulation method and apparatus using a multi-ary sampling of the present invention will be described below in more detail with reference to the accompanying drawings.

The embodiments of the present invention will be described with respect to the digital beam forming system which uses a multi-ary sampling method in an ultrasonic image apparatus. Prior to describing the embodiments of the present invention, an existing secondary sampling method which is used in the ultrasonic image apparatus will be described below with reference to FIG. 1.

Figure 1:
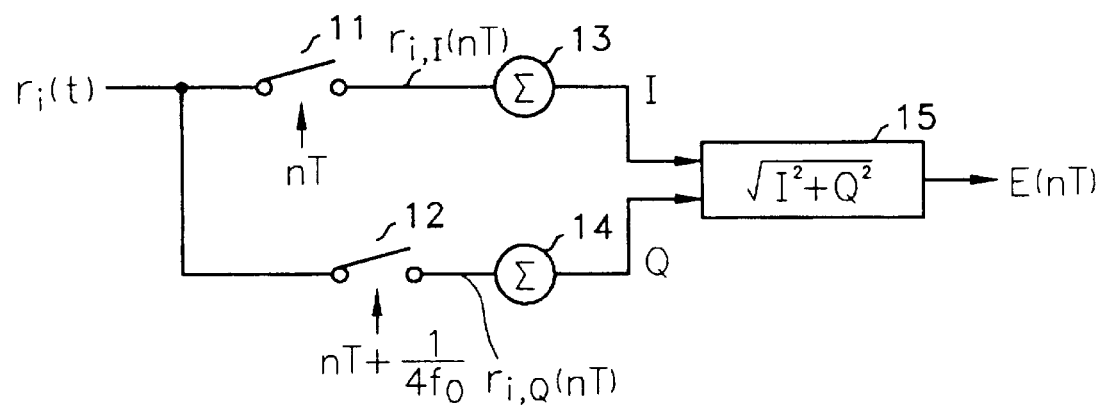
FIG. 1 is a circuit diagram for explaining an existing secondary sampling method.

FIG. 1 schematically shows an existing secondary sampling method. In FIG. 1, an ultrasonic signal input via each channel or each array element of a transducer array (not shown) is converted into an electrical signal. A received signal $r_i(t)$ is discerned by a subscript i corresponding to each channel or each array element. Thus, although the respective sampling units corresponding to subscript i are used in an actual circuit, a sampling units 11 and 12 corresponding to one channel or one array element are shown in FIG. 1 for simplicity. Signal $r_i(t)$ output from the array element is separated into two paths different from each other and sampled by a sampling unit 11 and sampling unit 12, respectively. A difference of time between sampling points of time of sampling units 11 and 12 becomes $1/(4f_0)$. That is, if sampling unit 11 samples a signal at time of nT, sampling unit 12 samples the signal at time of $nT+1/(4f_0)$, in which T is a period of time for the received signal. Signals I and Q with respect to an in-phase component and a quadrature component are obtained according to such a difference of the sampling points of time. Sampled signals are accumulated by accumulators 13 and 14, respectively. Accumulator 13 accumulates the in-phase signals with respect to all channels and outputs the accumulated signal, while accumulator 14 accumulates the quadrature signals with respect to all channels and outputs the accumulated signal. The accumulated signals are converted into an envelope signal $E_n(nT)$ by an envelope detector 15.

An error generated by the secondary sampling method referring to FIG. 1 is analyzed as follows. When an ultrasonic signal received at an ultrasonic image apparatus is denoted as r(t), it is expressed as the following equation (1).

$$r(t)=g(t)cos(w_0t+\theta) \quad (1)$$

Here, g(t) is a Gaussian envelope, $w_0$ is $2\pi f_0$, $\theta$ is a phase and $f_0$ is a center frequency. The Gaussian envelope is expressed as the following equation (2).

$$g(t) = \exp\left[-\left(\frac{\omega_0 t}{\sigma}\right)^2\right] \quad (2)$$

Figure 2:
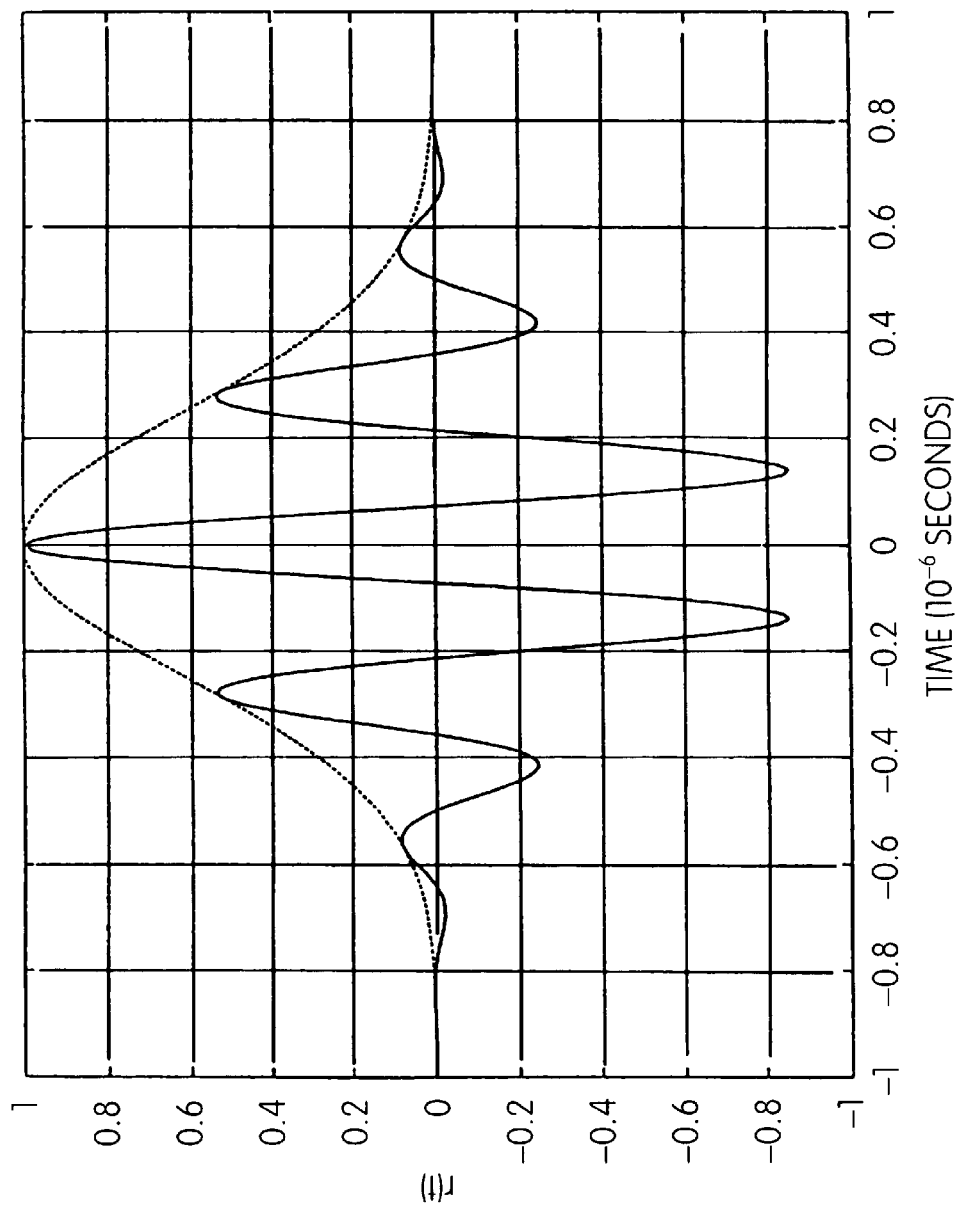
FIG. 2 is a graphical diagram showing an example of an ultrasonic signal which is usually used in an ultrasonic image apparatus.

Here, $\sigma$ is a constant for determining a bandwidth of the envelope. FIG. 2 shows an ultrasonic signal r(t) (a solid curve) and an envelope of the signal (a dotted curve) which are usually used in an ultrasonic image apparatus, in which $f_0$ is 3.5 MHz and $\theta$ is 2.5 $\pi$. If the equation (1) is multiplied by the sampling functions $\Sigma\delta(nT)$ and $\Sigma\delta(nT+\alpha)$, respectively, and $\alpha=1/(4f_0)$, the following equations (3) and (4) are obtained.

$$r_I(nT)=g(nT)cos(w_0nT+\theta) \quad (3)$$

$$r_Q(nT+\alpha)=-g(nT+\alpha)sin(w_0nT+\theta) \quad (4)$$

If the equation (3) represents an in-phase signal, equation (4) represents a quadrature signal. An envelope E(nT) is expressed as the following equation (5).

$$E(nT) = \sqrt{r_I^2(nT) + r_Q^2(nT + \alpha)} \quad (5)$$

The equation (5) is for finally extracting an envelope by the secondary sampling method. However, in the equation (5), the following equation (6) can be assumed.

$$r_Q(nT)\cong r_Q(nT+\alpha) \quad (6)$$

Thus, reduction of the error in the secondary sampling method is dependent upon how a value of the right-hand term in equation (6) is close to that of the left-hand term therein. To facilitate easy understanding of the error analysis, if the Gaussian envelope $g(nT+\alpha)$ is Tayler-series-developed and takes two lowest-order terms, the following equation (7) is obtained.

$$r_Q(nT+\alpha)\cong-[g(nT)+\alpha g'(nT)]sin(w_0nT+\theta) \quad (7)$$

In equation (7), the second term of the right-hand terms represents an error of the quadrature signal obtained by the secondary sampling method. The error is determined by a slope of the envelope and a sampling interval $\alpha$ at time t (=nT). Thus, as time $\alpha$ taken to obtain the Q-signal after obtaining the I-signal is larger, the error becomes severer. Also, if the slope of the envelope is larger, since a value of the envelope at a point where the Q-signal is obtained is greatly different from that with respect to the I-signal, the error becomes large. To more scrutinizingly analyze the error, equation (7) is substituted in equation (5), the following equation (8) is obtained.

$$E(nT) = [g^2(nT) + 2g'(nT)\alpha g'(nT)sin^2(w_0T + \theta) + \quad (8)$$
$$\alpha^2\{g'\}^2(nT)sin^2(w_0nT + \theta)]^{1/2}$$

A first differentiation g' (t) of Gaussian envelope g(t) is expressed as the following equation (9).

$$g'(t) = -2\left(\frac{\omega_0}{\sigma}\right)^2 tg(t) \quad (9)$$

The equations (8) and (9) are substituted in equation (7), the following equation (10) is obtained.

$$E(nT) \cong g(nT)\sqrt{1+\frac{4\pi^2 f_0}{\sigma^2}nT\left(\frac{\pi^2 f_0}{\sigma^2}nT-1\right)sin^2(w_0nT+\theta)} \quad (10)$$

In equation (10), the second term in the square-root term represents an error generated since $g(nT+\alpha)$ is not equal to g(nT), which is related to a frequency of the received signal.

Figure 3:
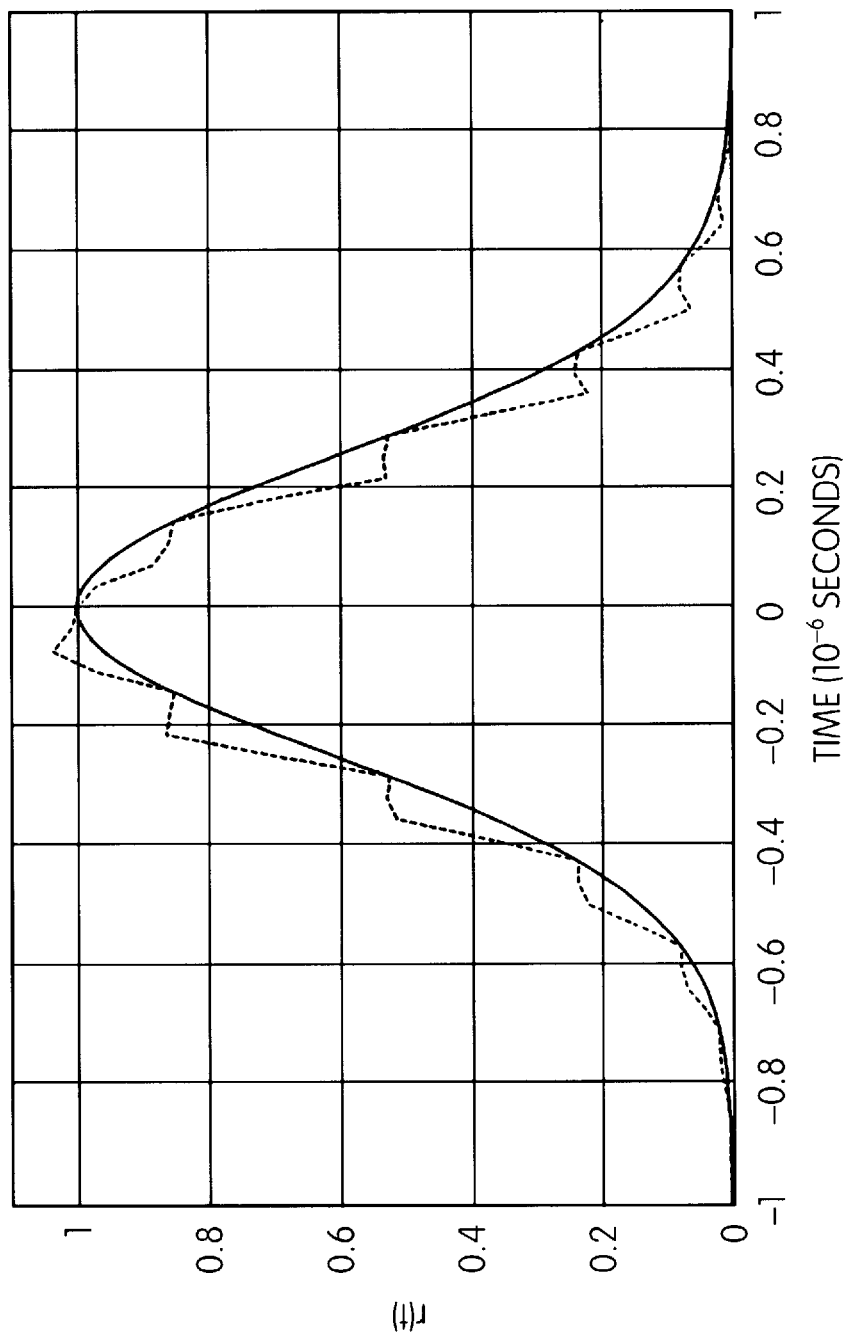
FIG. 3 is a graphical diagram for explaining a sampling error generated by the secondary sampling method.

FIG. 3 shows an ideal envelope (a solid curve) and a computer simulated envelope (a dotted curve) by the secondary sampling method. In FIG. 3, the envelope represented as dotted curve is obtained when $f_0$=3.5 MHz and $\theta$=2.5 $\pi$. As shown in equation (10) and in FIG. 3, the error of the secondary sampling method is represented as a periodic waveform since the error includes a sinusoidal component. Also, whenever a sine function becomes zero, it can be seen that no error occurs. However, since a phase of the reflected ultrasonic signal is not generally known, a point where the sine function becomes zero cannot be seen. To summarize, if the envelope of the general-purposed ultrasonic signal is obtained by using the secondary sampling method, it can be seen that the larger error is generated as shown in FIG. 3. The error in the secondary sampling method is due to a fact that the Q-signal cannot be obtained at time of obtaining the I-signal. Since such an error causes variation of the ultrasonic image, it is not appropriate to use the secondary sampling method for detection of the envelope.

Therefore, in this embodiment, a digital beam forming method using a multi-ary sampling method is presented so as to reduce a sampling error due to a difference between sampling points of time of the I-signal and Q-signal. The multi-ary sampling method presented in this embodiment will be described below.

To obtain the Q-signal at a point having a phase difference of $\pm(90°+180°\cdot l)$ with respect to the I-signal obtained a time t ($=nT$) as shown in equation (3), the received signal is sampled at time t ($=nT+(1-2l)\alpha$). Here, l is an integer, and $\alpha$ is $1/(4f_0)$. The Q-signal thus-obtained is represented as the following equation (11).

$$r_Q[nT + (1 - 2l)\alpha] = g[nT + (1 - 2l)\alpha]\cos[\omega_0\{nT + (1 - 2l)\alpha\} + \theta] \quad (11)$$
$$= -(-1)^l g[nT + (1 - 2l)\alpha]\sin(w_0 nT + \theta)$$

The Q-signal of equation (11) is a signal corresponding to the I-signal of equation (3), and includes an error. The sign of the Q-signal is changed according to a value of l which represents a sampling position and the magnitude thereof is also varied. The Q-signal having the minimum error is obtained when l=1, of which the value is represented as equation (4). The error of the Q-signal obtained as in equation (4) is too large to use in the ultrasonic image apparatus, which has been already referred to in connection with FIG. 3. To analyze the error included in equation (11), the term $g[nT+(1-2l)\alpha]$ is Tayler-series-developed by the m-th order differentiator term, the following equation (12) is obtained.

$$r_Q[nT + (1 - 2l)\alpha] \simeq \quad (12)$$
$$-(-1)^l \left[ g(nT) + (1 - 2l)\alpha g'(nT) + \frac{\{(1 - 2l)\alpha\}^2}{2!} g''(nT) + \right.$$
$$\left. \ldots + \frac{\{(1 - 2l)\alpha\}^m}{m!} g^{\{m\}}(nT) \right] \times \sin(w_0 nT + \theta)$$

An exact Q-signal becomes $g(nT)\sin(w_0 nT+\theta)$, However, the actually obtained Q-signal includes the error which is expressed as the m differentiator terms as in equation (12). In the present invention, the Q-signal having a considerably reduced error is obtained by eradicating such error terms.

A range of integer l is determined as following equation (13) according to a value of m.

$$\text{when } m \text{ is odd, } \frac{-m+1}{2} \leq l \leq \frac{m+1}{2} \quad (13)$$
$$\text{when } m \text{ is even, } -\frac{m}{2} \leq l \leq \frac{m}{2}$$

First, when m is odd, all the values of l are substituted in equation (12) and the equations corresponding thereto are obtained as the following equations (14), (15), (16) and (17).

$$r_Q[nT + m\alpha] \simeq -(-1)^{\frac{-m+1}{2}} \left[ g(nT) + m\alpha g'(nT) + \frac{(m\alpha)^2}{2!} g''(nT) + \right. \quad (14)$$
$$\left. \ldots + \frac{(m\alpha)^m}{m!} g^{\{m\}}(nT) \right] \times \sin(w_0 nT + \theta)$$

$$r_Q\left[nT + (m - 2)\alpha\right] \simeq -(-1)^{\frac{-m+3}{2}} [g(nT) + (m - 2)\alpha g'(nT) + \quad (15)$$
$$\frac{\{(m - 2)\alpha\}^2}{2!} g''(nT) + \ldots +$$
$$\frac{\{(m - 2)\alpha\}^m}{m!} g^{\{m\}}(nT) \right] \times \sin(w_0 nT + \theta)$$

$$\vdots$$

$$r_Q\left[nT - (m - 2)\alpha\right] \simeq -(-1)^{\frac{m-1}{2}} [g(nT) - (m - 2)\alpha g'(nT) + \quad (16)$$
$$\frac{\{-(m - 2)\alpha\}^2}{2!} g''(nT) + \ldots +$$
$$\frac{\{-(m - 2)\alpha\}^m}{m!} g^{\{m\}}(nT) \right] \times \sin(w_0 nT + \theta)$$

$$r_Q[nT - m\alpha] \simeq -(-1)^{\frac{m+1}{2}} [g(nT) - \quad (17)$$
$$m\alpha g'(nT) + \frac{(-m\alpha)^2}{2!} g''(nT) + \ldots +$$
$$\frac{(-m\alpha)^m}{m!} g^{\{m\}}(nT) \right] \times \sin(w_0 nT + \theta)$$

These equations are expressed as equation (18) by a matrix equation.

$$R = AG \, \sin(w_0 nT + \theta) \quad (18)$$

Here, R and G are $(m+1)\times 1$ matrix which is expressed as equations (19) and (20).

$$R = \begin{bmatrix} r_Q(nT + m\alpha) \\ r_Q(nT + (m - 2)\alpha) \\ \cdot \\ \cdot \\ \cdot \\ r_Q(nT - m\alpha) \end{bmatrix} \quad (19)$$

$$G = - \begin{bmatrix} g(nT) \\ \alpha g'(nT) \\ \alpha^2 g''(nT) \\ \cdot \\ \cdot \\ \cdot \\ \alpha^m g^{\{m\}}(nT) \end{bmatrix} \quad (20)$$

Also, A is $(m+1)\times(m+1)$ matrix which is expressed as the following equation (21).

$$A = \begin{bmatrix} (-1)^{\frac{-m+1}{2}} & (-1)^{\frac{-m+1}{2}}(m) & (-1)^{\frac{-m+1}{2}}\frac{(m)^2}{2!} & \cdots & (-1)^{\frac{-m+1}{2}}\frac{(m)^m}{m!} \\ (-1)^{\frac{-m+3}{2}} & (-1)^{\frac{-m+3}{2}}(m-2) & (-1)^{\frac{-m+3}{2}}\frac{(m-2)^2}{2!} & \cdots & (-1)^{\frac{-m+3}{2}}\frac{(m-2)^m}{m!} \\ & & \vdots & & \\ (-1)^{\frac{m-1}{2}} & (-1)^{\frac{m-1}{2}}\{-(m-2)\} & (-1)^{\frac{m-1}{2}}\frac{\{-(m-2)\}^2}{2!} & \cdots & (-1)^{\frac{m-1}{2}}\frac{\{-(m-2)\}^m}{m!} \end{bmatrix} \quad (21)$$

When m is also even, if the equation is developed by the similar method to that when m is odd, matrix G is the same as in equation (20), and matrices R and A are obtained by the following equations (22) and (23).

$$R = \begin{bmatrix} r_Q(nT + (m+1)\alpha) \\ r_Q(nT + (m-1)\alpha) \\ \vdots \\ r_Q(nT - (m-1)\alpha) \end{bmatrix} \quad (22)$$

$$A = \begin{bmatrix} (-1)^{\frac{-m}{2}} & (-1)^{\frac{-m}{2}}(m+1) & (-1)^{\frac{-m}{2}}\frac{(m+1)^2}{2!} & \cdots & (-1)^{\frac{-m}{2}}\frac{(m+1)^m}{m!} \\ (-1)^{\frac{-m}{2}+1} & (-1)^{\frac{-m}{2}+1}(m-1) & (-1)^{\frac{-m}{2}+1}\frac{(m-1)^2}{2!} & \cdots & (-1)^{\frac{-m}{2}+1}\frac{(m-1)^m}{m!} \\ & & \vdots & & \\ (-1)^{\frac{m}{2}} & (-1)^{\frac{m}{2}}\{-(m-1)\} & (-1)^{\frac{m}{2}}\frac{\{-(m-1)\}^2}{2!} & \cdots & (-1)^{\frac{m}{2}}\frac{\{-(m-1)\}^m}{m!} \end{bmatrix} \quad (23)$$

If equation (18) is solved with respect to matrix G, the following equation (24) is obtained.

$$G\,\sin(w_0 nT + \theta) \approx A^{-1} R \quad (24)$$

Here, an inverse matrix of matrix A is defined as matrix B, matrix B is expressed as the following equation (25).

$$A^{-1} = B = \begin{bmatrix} b_{11} & b_{12} & \cdots & b_{1(m+1)} \\ b_{21} & b_{22} & \cdots & b_{2(m+1)} \\ & & \vdots & \\ b_{(m+1)1} & b_{(m+1)2} & \cdots & b_{(m+1)(m+1)} \end{bmatrix} \quad (25)$$

The Q-signal from which the error is reduced is a value of the first row in matrix G of equation (24). When m is odd, the Q-signal is obtained as the following equation (26) from equations (19), (20), (24) and (25).

$$\begin{aligned} r_Q(nT) &= -g(nT)\sin(w_0 nT + \theta) \\ &= b_{11} r_Q[nT + m\alpha] + b_{12} r_Q[nT + (m-2)\alpha] + \\ &\quad \ldots + b_{1(m+1)} r_Q[nT - m\alpha] \end{aligned} \quad (26)$$

Also, when m is even, the Q-signal is obtained as the following equation (27) from equations (20), (22), (23) and (24).

$$\begin{aligned} r_Q(nT) &= -g(nT)\sin(w_0 nT + \theta) \\ &= b_{11} r_Q[nT + (m+1)\alpha] + b_{12} r_Q[nT + (m-1)\alpha] + \\ &\quad \ldots + b_{1(m+1)} r_Q[nT - (m-1)\alpha] \end{aligned} \quad (27)$$

The Q-signal obtained from equations (26) and (27) has a very smaller error than that of equation (4). This is grounded on a fact that $g(nT+\alpha)$ is obtained from equation (4) instead of $g(nT)$ while a closer value to $g(nT)$ is obtained from equation (26) by eradicating m differentiator terms in $g(nT+\alpha)$. Thus, the larger m, the exacter value can be obtained. That is, the more data, the more accurate $g(nT)$ can be estimated by using matrix A. However, in this case, the hardware for realizing $g(nT)$ will be complicated, when m=1, l has a value of 0 or 1. The matrix equation (18) is expressed as the following equation (28).

$$\begin{bmatrix} r_Q(nT+\alpha) \\ r_Q(nT-\alpha) \end{bmatrix} = -\begin{bmatrix} 1 & 1 \\ -1 & 1 \end{bmatrix} \begin{bmatrix} g(nT) \\ \alpha g'(nT) \end{bmatrix} \sin(w_0 nT + \theta) \quad (28)$$

If equation (28) is solved with respect to matrix G as in equation (24), the following equation (29) is obtained.

$$-\begin{bmatrix} g(nT) \\ \alpha g'(nT) \end{bmatrix} \sin(w_0 nT + \theta) = \frac{1}{2} \begin{bmatrix} 1 & -1 \\ 1 & 1 \end{bmatrix} \begin{bmatrix} r_Q(nT+\alpha) \\ r_Q(nT-\alpha) \end{bmatrix} \quad (29)$$

Therefore, the Q-signal from which the error is reduced is obtained as the following equation (30).

$$r_Q(nT) = -g(nT)\sin(w_0nT + \theta) \simeq \frac{1}{2} [r_Q(nT + \alpha) - r_Q(nT - \alpha)] \quad (30)$$

The equation (30) represents that the Q-signal from which the error corresponding to the term $\alpha g'(nT)$ is reduced can be obtained if a difference between the sampled values at two positions of t ($=nT\pm\alpha$) when the I-signal has been obtained at time T ($=nT$), is divided by two.

On the other hand, when m=2, a value of l is −1, 0 or 1. When m=2 the matrix equation (18) is expressed as following equation (31).

$$\begin{bmatrix} r_Q(nT + 3\alpha) \\ r_Q(nT + \alpha) \\ r_Q(nT - \alpha) \end{bmatrix} \simeq - \begin{bmatrix} -1 & -3 & (-1)\frac{9}{2} \\ 1 & 1 & \frac{1}{2} \\ -1 & 1 & -\frac{1}{2} \end{bmatrix} \begin{bmatrix} g(nT) \\ \alpha g'(nT) \\ \alpha^2 g''(nT) \end{bmatrix} \sin(\omega_0 nT + \theta) \quad (31)$$

The matrix G is obtained as the following equation (32) from equation (31).

$$-\begin{bmatrix} g(nT) \\ \alpha g'(nT) \\ \alpha^2 g''(nT) \end{bmatrix} \sin(w_0 nT + \theta) \simeq \frac{1}{8} \begin{bmatrix} 1 & 6 & -3 \\ 0 & 4 & 4 \\ -2 & -4 & -2 \end{bmatrix} \begin{bmatrix} r_Q(nT + 3\alpha) \\ r_Q(nT + \alpha) \\ r_Q(nT - \alpha) \end{bmatrix} \quad (32)$$

Therefore, the Q-signal from which the error is reduced is expressed as the following equation (33).

$$r_Q(nT) = -g(nT)\sin(w_0 nT + \theta) \quad (33)$$
$$\simeq \frac{1}{8}[r(nT + 3\alpha) + 6r(nT + \alpha) - 3r(nT - \alpha)]$$

The Q-signal obtained from equation (33) is a signal which is obtained by reducing the error corresponding to $\alpha g'(nT)$ and $\alpha^2 g''(nT)$, which becomes more precise than that obtained from equation (30).

Figure 4:
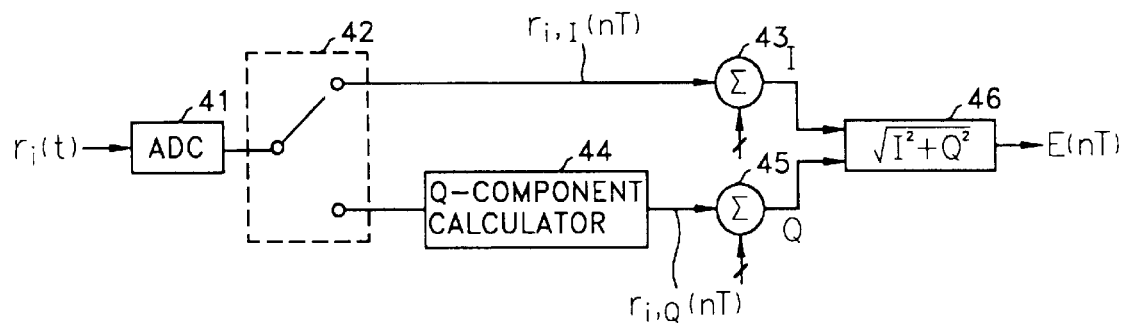
FIG. 4 is a circuit diagram of a digital beam forming apparatus using a multi-ary sampling method according to a first embodiment of the present invention.

FIG. 4 is a circuit diagram of a digital beam forming apparatus to which a signal modulation method is applied using a multi-ary sampling method according to a first embodiment of the present invention. An ultrasonic signal input via each channel or each array element of a transducer array (not shown) is converted into an electrical signal. A received signal $r_i(t)$ is discerned by a subscript i corresponding to each channel or each array element. In FIG. 4, for simplicity, an analog-to-digital converter 41, a switching circuit 42 and a Q-component calculator 44 corresponding to one channel are shown. The respective channels include such circuits in the same way. The analog-to-digital converter and the switching circuit are designed so as to be appropriate to each channel. This is due to a fact that the ultrasonic signal reflected from the scattered particle has a different reception point in each array element or each channel. The signal $r_i(t)$ received in the array via i-th channel is applied to analog-to-digital (A/D) converter 41. A/D converter 41 converts the analog signals applied from the array elements into digital signals and outputs the digital signals. A/D converter 41 samples the received signal at time $t[=nT+(1-2l)\alpha]$, to obtain the Q-signal $r_{i,Q}(t)$ at a position having a phase difference of $\pm(90°+180°\cdot l)$ with respect to the I-signal $r_{i,I}(t)$ of the received signal $R_i(t)$ obtained at time t ($=nT$). Here, l is an integer, $\alpha=1/(4f_0)$. Switching circuit 42 supplies the output signal of A/D converter 41 to accumulator 43 and Q-component calculator 44. Switching circuit 42 includes a plurality of switches corresponding to each channel. The switching operation of each switch is determined in dependence upon how many Q-signals $r_{i,Q}(t)$ which are located in the periphery of the I-signal $r_{i,I}(nT)$ are used for obtaining a proper Q-signal $r_{i,Q}(nT)$ corresponding to the I-component signal. An example of the operation of switching circuit 42 will be described later with reference to FIG. 5. Accumulator 43 accumulates I-signal $r_{i,I}(nT)$ applied from A/D converter 41 and the I-signals obtained with respect to the other channels. Q-component calculator 44 is embodied according to the above equations (26) and (27), which generates Q-signal $r_{i,Q}(nT)$ with respect to the i-channel from the signal applied via switching circuit 42. The signal output from Q-component calculator 44 and the corresponding signals obtained with respect to the other channels are accumulated in accumulator 45. As described above, since a signal reaching distance between the respective channels of the array from the reflecting object is different from each other, each element of the array becomes to receive the ultrasonic signal reflected at the same point of time from the reflecting object, at a different point of time from each other. Accumulator 43 or 45 accumulates the input signals to reduce a difference between the reception points of time of the ultrasonic signal in each array element. An envelope detector 46 uses signals I and Q input from accumulators 43 and 45 and detects an envelope signal E(nT) with respect to the received ultrasonic signal. The FIG. 4 apparatus can obtain envelope signal E(nT) of which the sampling error described referring to equation (6) is more reduced than that of the existing secondary sampling method as shown in FIG. 1.

Figure 5A:
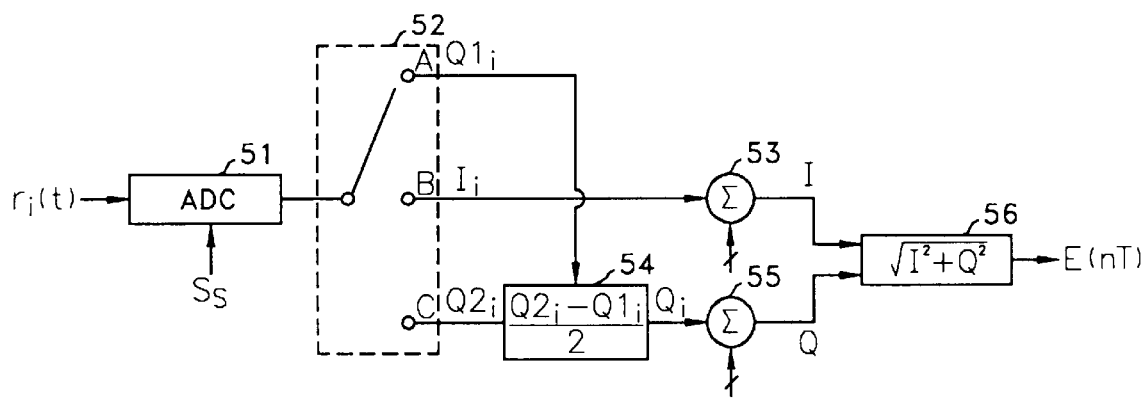
FIG. 5A is a circuit diagram of a digital beam forming apparatus using a multi-ary sampling method according to a second embodiment of the present invention.
Figure 5B:
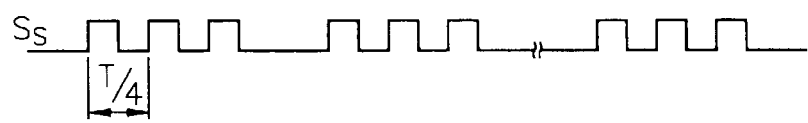
FIG. 5B is a waveform diagram showing clock which is used for sampling the signals in the FIG. 5A apparatus.
Figure 6:
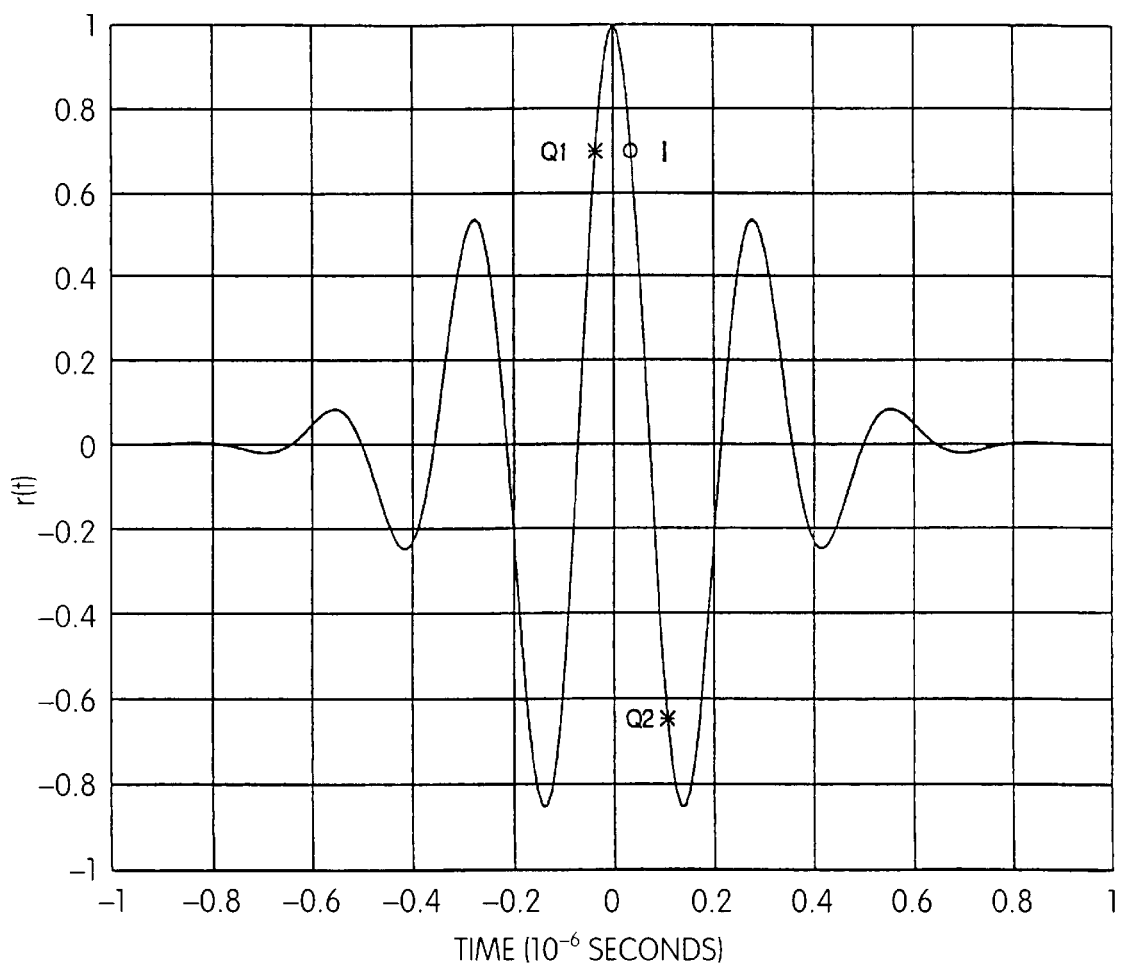
FIG. 6 is a graphical diagram showing a sampling position of the received signal in case a value of "m" is one.

FIG. 5A is a circuit diagram of a digital beam forming apparatus using a multi-ary sampling method according to a second embodiment of the present invention. FIG. 5A shows a digital beam forming apparatus using a ternary sampling method. That is, FIG. 5A is a circuit diagram using equation (30) when the number m of the differentiator terms in the Tayler series development is one. FIG. 5B is a waveform diagram showing clock which is used for sampling the signals in the FIG. 5A apparatus. FIG. 6 is a graphical diagram showing a sampling position of the received signal in case a value of "m" is one. In FIG. 5A, the circuits before accumulators 53 and 55 have the same constitution with respect to each channel as in FIG. 4.

In FIG. 5A, signal $r_i(t)$ received to the array via the i-channel is applied to A/D converter 51. A/D converter 51 samples the analog input signal and converts the received analog input signal into the digital signal according to a sampling clock $S_S$ and outputs the digital signal. Sampling clock $S_S$ has a period of T/4 ($=1/(4f_0)$) with respect to center frequency $f_0$ of the received signal. More specifically, A/D converter 51 outputs I-signal $I_i$ which is obtained at time t ($=nT$), and Q-signals $Q1_i$ and $Q2_i$ obtained at two positions of t ($=nT\pm\alpha$) of equation (30) and $Q2_i$ is $r_Q(nT+\alpha)$ in the same equation (34). Switching circuit 52 selectively outputs the output signals of A/D converter 51 via three output ends A, B and C, respectively. When the Q-signal $Q1_i$ of time t ($=nT-\alpha$) leading the I-signal $I_i$ is applied to the input end of the switching circuit 52, switching circuit 52 outputs the Q-signal via output end A, while when I-signal $I_i$ of time t ($=nT$) is applied thereto, switching circuit 52 the I-signal $I_i$ via output end B thereof. Also, when the Q-signal $Q2_i$ of time t ($=NT+\alpha$) is applied thereto, switching circuit 52 outputs the Q-signal via output end C. The Q-component calculator 54 receives Q-signals $Q1_i$ and $Q2_i$ being the first and third sampled value, obtains the difference between two signals, divides the obtained difference by two, and obtains Q-signal $Q_i$ corresponding to I-signal $I_i$. More specifically, Q-component calculator 54 performs an operation of $(Q2_i - Q1_i)/2$ to obtain Q-signal $Q_i$. The positions of $Q1_i$ and $Q2_i$ are shown in FIG. 6. Accumulator 53 accumulates I-signals with respect to all elements in the array and outputs the accumulated result, while accumulator 55 accumulates Q-signals with respect to all elements in the array and outputs the accumulated result. Envelope detector 56 squares the I-signal I from accumulator 53 and the Q-signal Q from accumulator Q, respectively, and square-roots sum of the squared values, to produce an envelope signal E(nT).

Although two A/D converters are required with respect to each channel in the quadrature sampling method and a Hilbert sampling method, the FIG. 5A circuit uses a single A/D converter with respect to each channel. Accordingly, an amount of the hardware can be greatly reduced to be economic further, sing the FIG. 5A circuit does not use any analog circuits differently from the above conventional methods, realization thereof is easy, performance thereof is excellent, only digital circuit enables a focusing operation, which is called a full digital system.

However, to lower a sampling frequency of the A/D converter, the FIG. 5A apparatus can be modified using two A/D converters as shown in FIG. 7A.

FIG. 7A is a circuit diagram of a digital beam forming apparatus using a ternary sampling method according to a third embodiment of the present invention. The FIG. 7A apparatus uses two A/D converters 71 and 72 with respect to each channel. The sampling clocks which are used in A/D converters 71 and 72, respectively are shown in FIGS. 7B and 7C. The FIG. 7A apparatus has the same blocks 53, 54, 55 and 56 as those of the FIG. 5A apparatus. The blocks having the same reference numerals as those of the FIG. 5A perform the same functions as those of the FIG. 5A. A/D converter 71 operates according to a sampling clock $S_I$ shown in FIG. 7B, while A/D converter 72 operates according to a sampling clock $S_Q$ shown in FIG. 7C. Sampling clocks $S_I$ and $S_Q$ are individual clocks having the same frequency. The points of time when applied to A/D converters 71 and 72 are different from each other by $1/(4f_0)$. Also, a pulse of sampling clock $S_I$ is positioned between two adjacent pulses of sampling clock $S_Q$. For this reason, sampling clocks $S_I$ and $S_Q$ have half of the frequency of the sampling clock which is used in the FIG. 5A apparatus. That is, the speed of A/D converters 71 and 72 becomes $2f_0$, to thereby lower the conditions with respect to the A/D converter. A/D converter 71 analog-to-digital converts the i-channel signal into a digital signal to produce an I-signal $I_i$. A/D converter 72 produces Q-signals $Q1_i$ and $Q2_i$ corresponding to I-signal $I_i$ output from A/D converter 71, and outputs the produced Q-signals $Q1_i$ and $Q2_i$. Switching circuit 73 outputs Q-signals $Q1_i$ and $Q2_i$ for Q-component calculator 54 so as for Q-component calculator 54 to perform an exact operation. Since the other signal processing is identical that of the FIG. 5A apparatus, the detailed descriptions will be omitted.

FIG. 8A is a circuit diagram of a digital beam forming apparatus using a ternary sampling method according to a fourth embodiment of the present invention. FIGS. 8B through 8D show signals $S_{CK}$, $S_{CLS}$ and SF which are used in the FIG. 8A apparatus. The FIG. 8A apparatus does not separately process the I-signal component and the Q-signal component, but processes the signals using a single path or channel, in which point the FIG. 8A apparatus is different from the FIG. 5A apparatus or the FIG. 7A apparatus. The FIG. 8A apparatus includes an A/D converter 81, an I and Q component calculator 82 and a first-in-first-out (FIFO) memory 83 with respect to one channel. The signals of all the channels allowable in the digital beam forming apparatus are processes by the same blocks as the above-described blocks and then input to accumulator 84. In FIG. 8A, a signal $r_i(t)$ input via channel i is supplied to A/D converter 81. A/D converter 81 converts input signal $r_i(t)$ into an 8-bit digital signal according to clock signal $S_{CK}$ of FIG. 8B and outputs the converted signal. I and Q component calculator 82 includes latches 821, 823 and 825 and subtracter 827. Latches 821, 823 and 825 operate according to an identical clock. Second latch 823 and third latch 825 receive a clear signal $S_{CLS}$ shown in FIG. 8C, respectively. If Q1 is output from first latch 821 by clock pulse S1, Q1 is input to a positive input end of subtracter 827. At this time, third latch 825 is cleared by clear signal $S_{CKS}$ to output zero for a negative input end of subtracter 827. As a result, subtracter 827 outputs Q1 at the time when clock pulse S1 is input thereto. Since the writing signal SF of FIG. 8D does not have a pulse corresponding to clock pulse S1, data Q1 generated by clock pulse S1 is not stored in FIFO memory 83. If clock pulse S2 is input to the respective lathes, subtracter 827 outputs I-signal $I_i$ and FIFO memory 83 stores the input I-signal $I_i$ according to the clock pulse of the writing signal SF. If clock pulse S3 is input the the respective latches, subtracter 827 outputs $Q_i$ (=$(Q2_i-Q1_i)/2$) which is obtained by dividing a difference between two Q-signals $Q2_i$ and $Q1_i$ adjacent to I-signal $I_i$ by two. If the above subtracter 827 is a 9-bit subtracter, a dividing-by-two operation is accomplished by an operation for outputting the eight upper bits of $Q2_i$-$Q1_i$. FIFO memory 83 stores Q-signal $Q_i$ applied from subtracter 827 according to a clock of writing signal SF. That is, I-signal data $I_i$ and Q-signal data $Q_i$ produced according to clock pulses S2 and S3 are stored in FIFO memory 83 in sequence outputting from subtracter 827. Thus, FIFO memory 83 alternately stores the I-signal data and the Q-signal data sequentially output from subtracter 827. The operation of I and Q component calculator 82 is summarized in the following Table 1.

TABLE 1

|  | D1 | D2 | D3 | SUBRACTOR OUTPUT(D4) |
|---|---|---|---|---|
| CLOCK S1 | $Q1_i$ | 0 | 0 | $Q1_i$ |
| CLOCK S2 | $I_i$ | $Q1_i$ | 0 | $I_i$ |
| CLOCK S3 | $Q2_i$ | $I_i$ | $Q1_i$ | $Q_i = (Q2_i - Q1_i)/2$ |

Accumulator 84 accumulates the I-signal data and the Q-signal data sequentially applied from the FIFO memories of all the channels, by the respective components. The accumulated I-signal data and the Q-signal data are supplied to an envelope detector (not shown) and is used for envelope detection.

The FIG. 8A circuit uses a single A/D converter and a single FIFO memory with respect to each channel of the array. Accordingly, compared with the quadrature sampling method and the analytic sampling method, the circuit cannot be only simplified, but the Q-signal can be also detected more accurately than that of the existing secondary sampling method.

Figure 9:
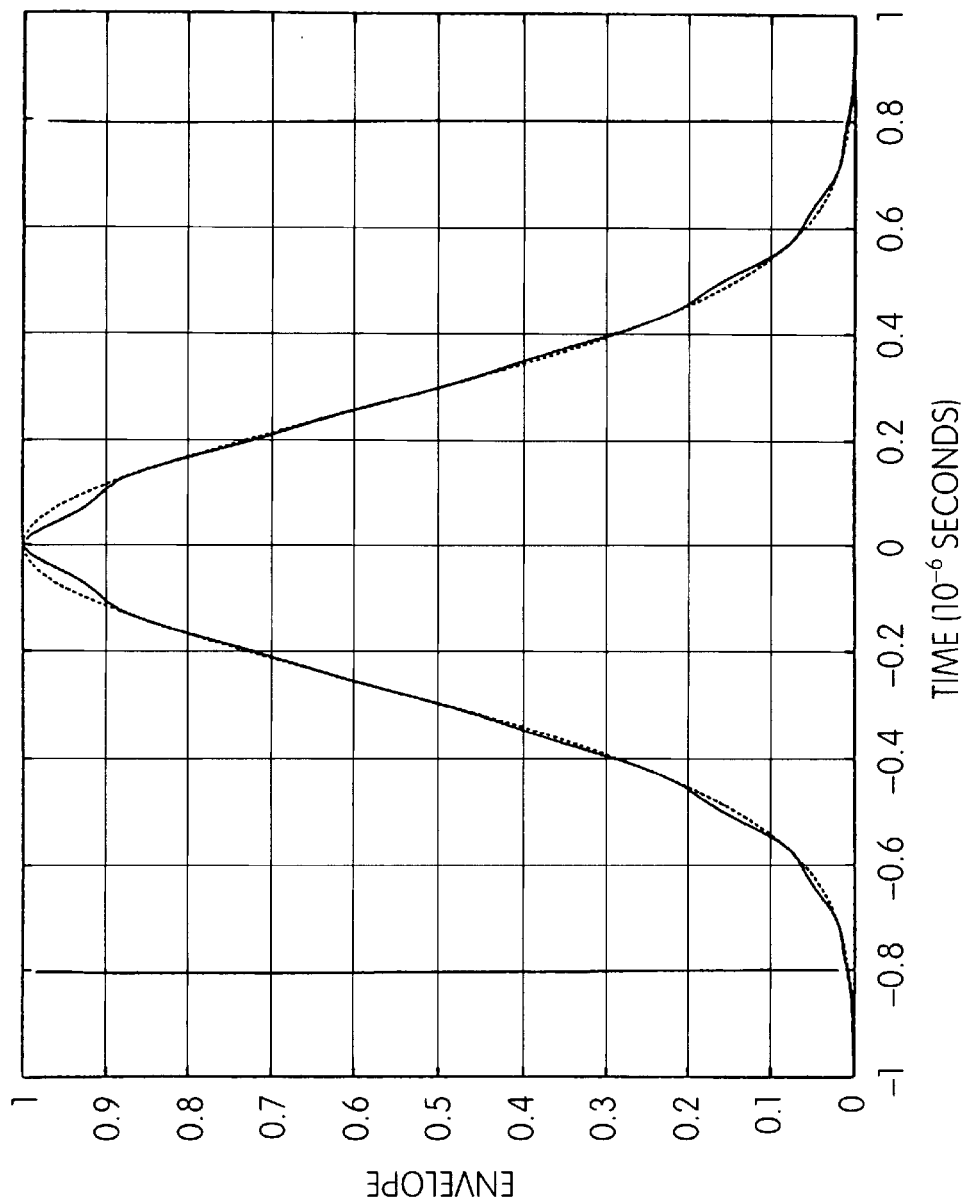
FIGS. 9 through 13 are graphical diagrams showing results obtained by a computer simulation under condition where a value of σ equals 2.5 π.
Figure 10:
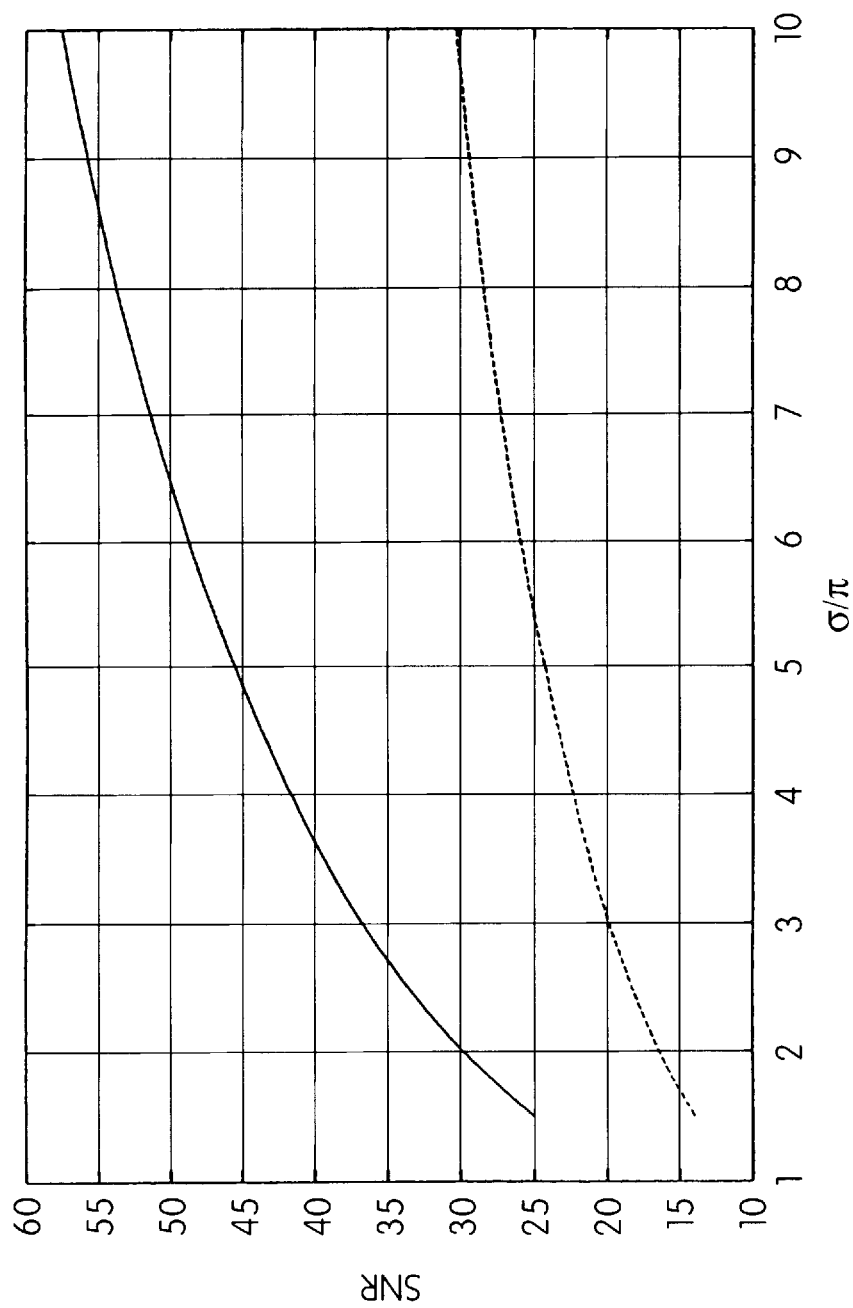
Figure 11:
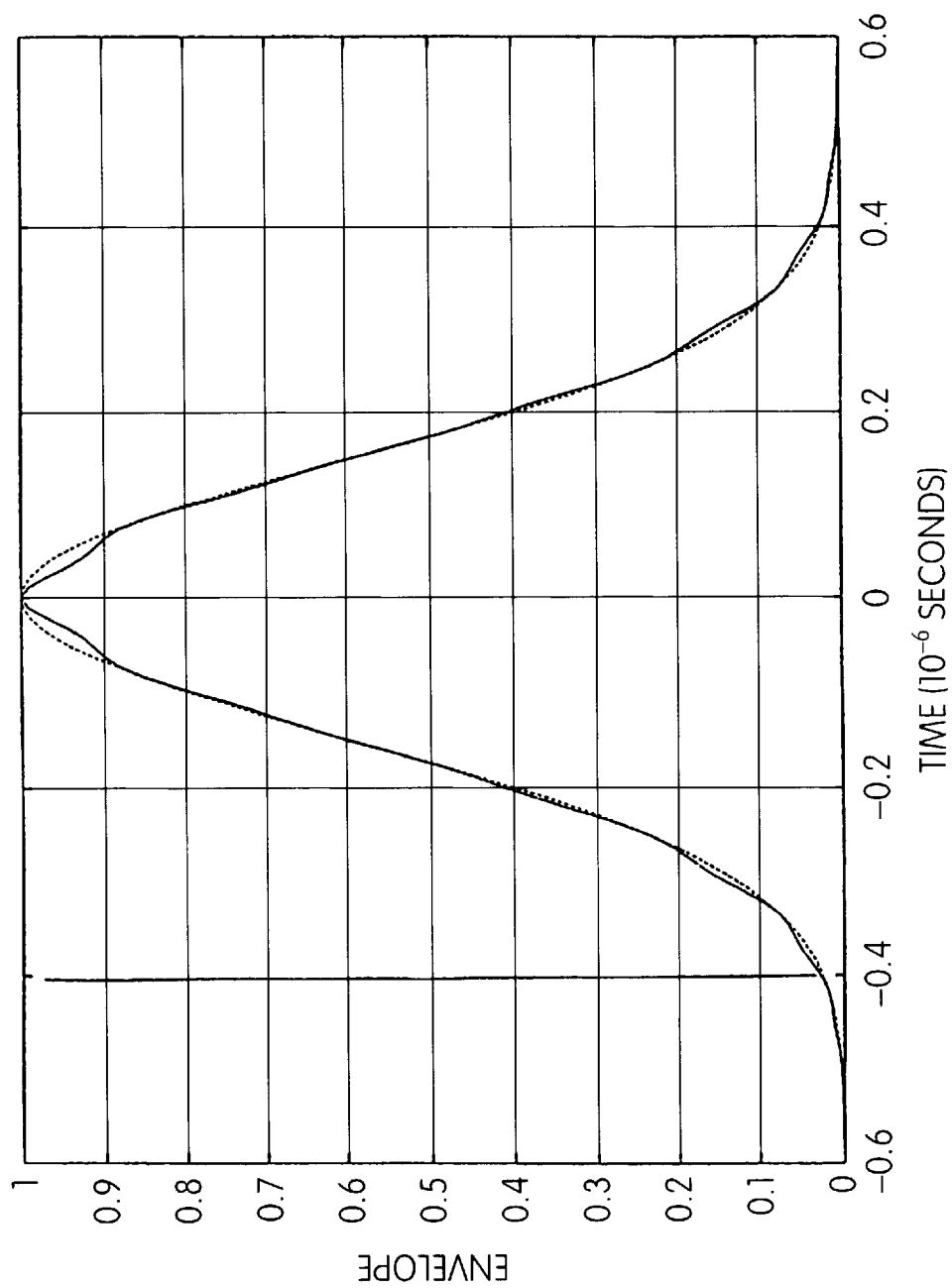
Figure 12:
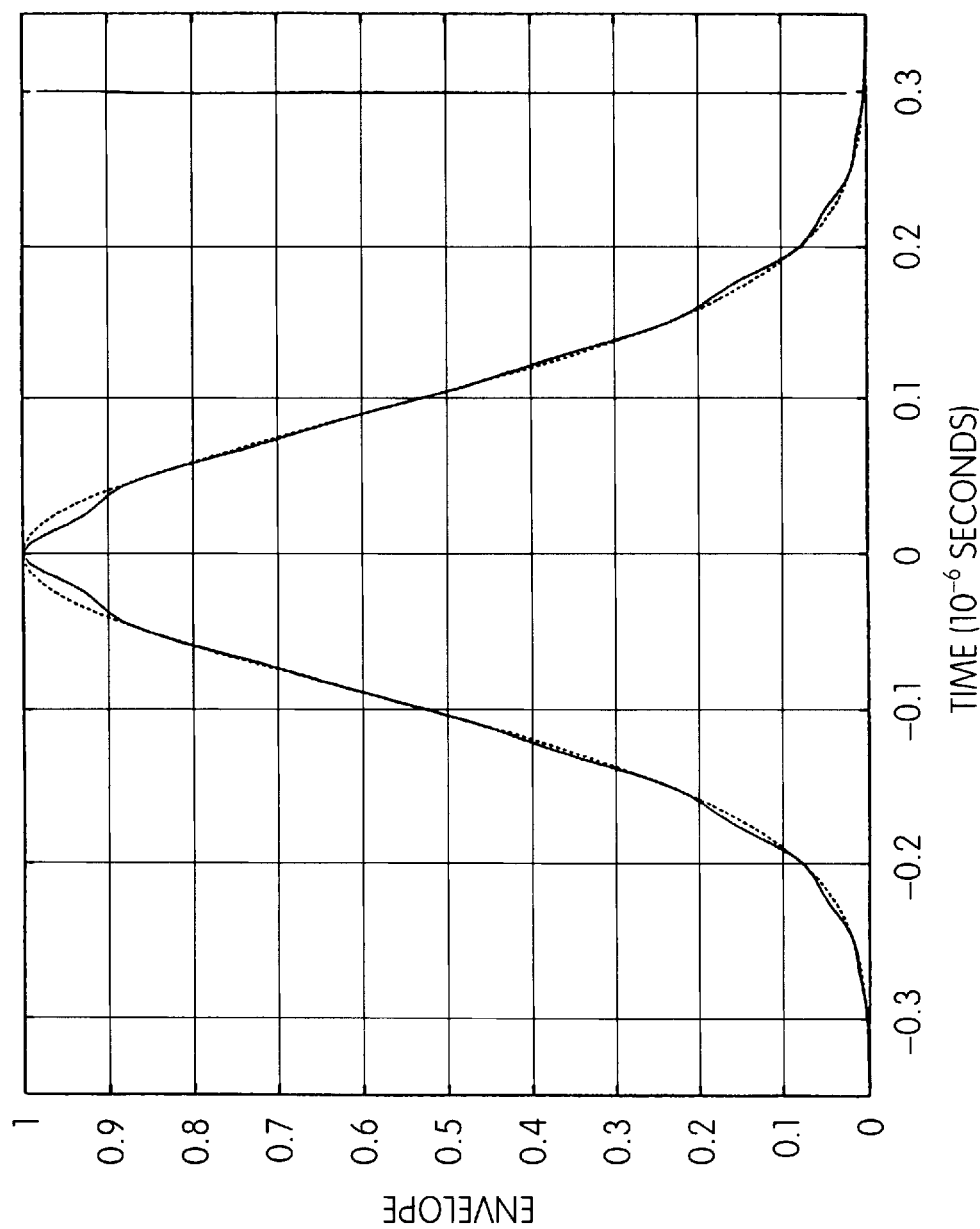
Figure 13:
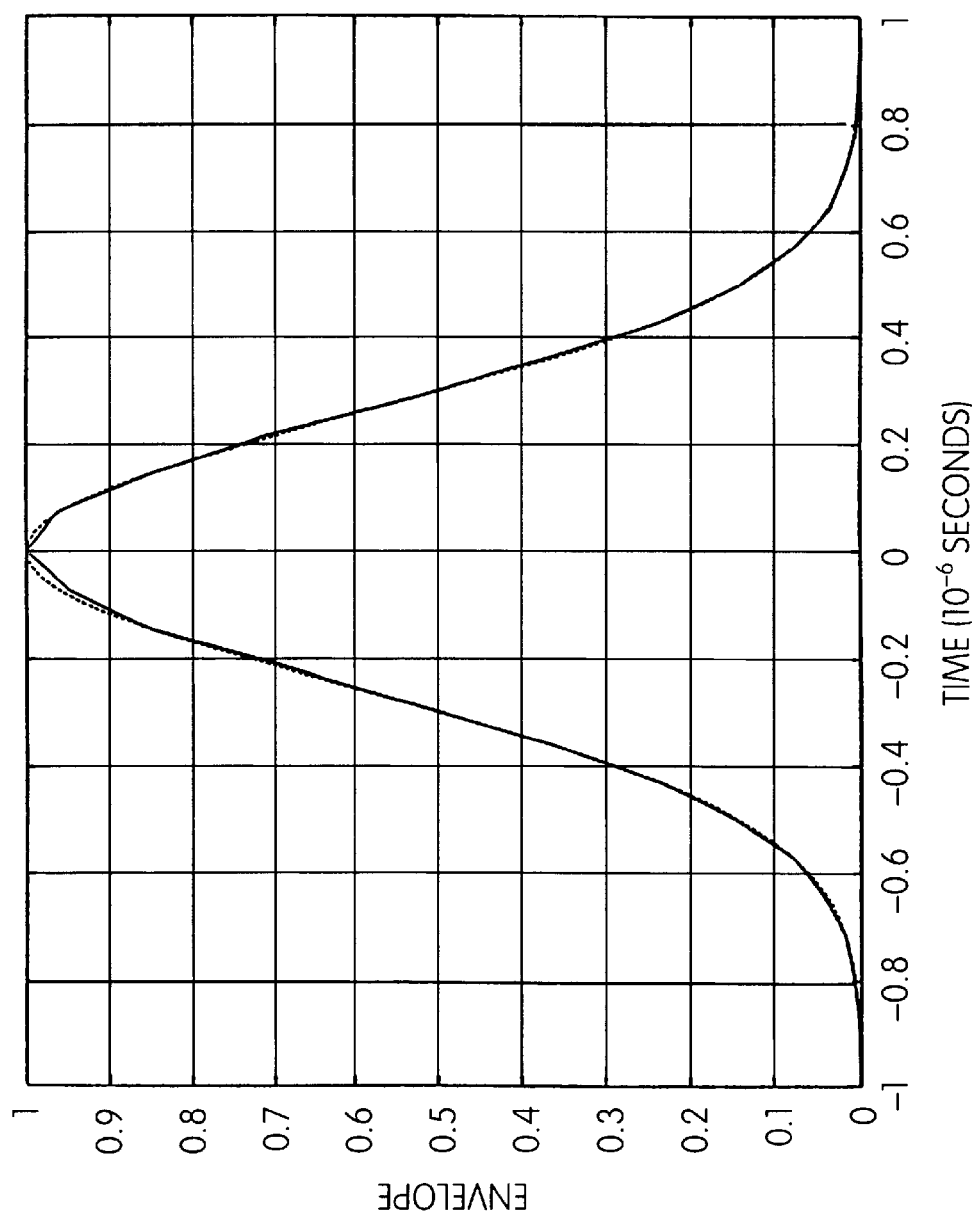

FIGS. 9 through 13 are graphical diagrams showing results obtained by a computer simulation under condition where a value of $\sigma$ equals $2.5\pi$. The reason why a value of $\sigma$ is fixed to $2.5\pi$ is for matching a bandwidth of a signal used in the computer simulation with that of a signal which is usually used in an ultrasonic image apparatus. FIG. 9 shows an ideal envelope (a dotted curve) of an ultrasonic signal, and an envelope (a solid curve) obtained by a ternary sampling method according to the present invention, respectively. The envelope represented as a solid curve in FIG. 9 is an envelope obtained by using a ternary sampling method of the present invention when a value of $f_0$ is 3.5 MHz and a value of m is one. FIG. 10 shows a signal-to-noise ratio of the present invention and that of the existing secondary sampling method, respectively. As can be seen from FIG. 10, the ternary sampling method according to the present invention can reduce remarkably the errors generated by the existing secondary sampling method shown in FIG. 3. FIGS. 11 and 12 shows results which are obtained by analyzing the errors according to variation of a center frequency $f_0$. The frequency $f_0$ of the signal used for analysis is 6 MHz in FIG. 11, and 10 MHz in FIG. 12. Compared FIG. 11 with FIG. 12, it can be seen that the method proposed in the present invention is not so significantly affected by variation of the center frequency. FIG. 13 shows an envelope which is obtained by eradicating the error due to the term $\alpha g''(nT)$ in equation (37) when m=2, that is, in the four-ary sampling method. The case when m=2 can be constituted by the similar hardware to that when m=1. However, signal sampling positions for obtaining the Q-signal are three when $t=nT\pm\alpha$ and $t=nT+3\alpha$, in which an operation of equation (37) of equation (24) should be performed. Although this method can reduce more errors than that of eradication $g'(nT)$, the hardware constitution is relatively complicated because the three kinds of the data should be processed. However, it will applicable to a real-time processing if any application specified integrated circuit (ASIC) chip is used.

Figure 14:
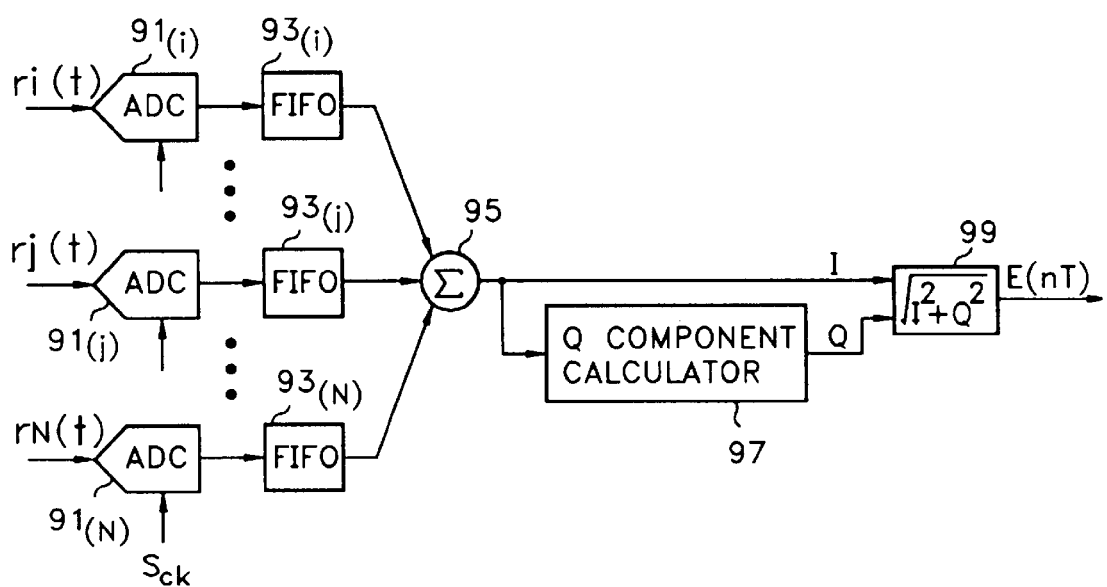
FIG. 14 is a circuit diagram of a digital beam forming apparatus using a multi-ary sampling method according to a fifth embodiment of the present invention.

FIG. 14 is a circuit diagram of a digital beam forming apparatus using a multi-ary sampling method according to a fifth embodiment of the present invention. The FIG. 14 apparatus uses an envelope signal differently from the above-described embodiments, that is, an envelope signal obtained from the input signals via the respective array elements in the transducer array, to perform a multi-ary sampling method. In FIG. 14, A/D converters $91_{(1)}, \ldots, 91_{(i)}, \ldots, 91_{(N)}$ converts the analog signals input via the respective array elements in the transducer array (not shown) into the digital signals, and outputs the converted signals. Here, the subscripts from 1 to N correspond to the respective array elements. FIFO memories $93_{(1)}, \ldots, 93_{(i)}, \ldots, 93_{(N)}$ output the stored signals in sequence inputted thereto, and synchronize the signals received at different points of time from each other although the respective array elements in the transducer array are reflected from the reflecting objects at an identical point of time. The synchronized signals are output from the FIFO memories, respectively. Since a technology that FIFO memories $93_{(1)}, \ldots, 93_{(i)}, \ldots, 93_{(N)}$ synchronize the signals obtained from the reflected object at an identical point of time with each other and output the synchronized signal is well known, the detailed descriptions will be omitted. Accumulator 95 accumulates the signals input at the identical point of time from FIFO memories $93_{(1)}, \ldots, 93_{(i)}, \ldots, 93_{(N)}$ and outputs the accumulated signal. Q-component calculator 97 uses the multi-ary sampling method proposed by the present invention and generates a Q-signal obtained at a substantial identical point of time to that of an I-signal from various signals input from accumulator 95. Envelope detector 99 calculates an envelope signal from the Q-signal generated by Q-component operator 97 and the I-signal corresponding to the Q-signal and outputs the calculated signal. Even though the FIG. 14 apparatus is used, an error due to a difference between the points of time of obtaining the sampling data in the same degree as those of the above-described apparatuses, that is the apparatuses employing the multi-ary sampling with respect to the respective outputs of the array elements, can be reduce.

As described above, more than two Q-signals are obtained on the basis of the I-signal and calculates the Q-signal corresponding to the I-signal. It is possible to embody a variation which calculates the I-signal corresponding to the Q-signal by obtaining more than two I-signal on the basis of the Q-signal.

As described above, the multi-ary sampling adapted in the present invention uses a simple digital hardware compared with that of the existing secondary sampling method, to thereby obtain a more exact I-signal and the Q-signal corresponding to the I-signal. When the multi-ary sampling of the present invention is used for the ultrasonic image apparatus, the error of the envelope detection are greatly reduced when compared with the existing secondary sampling method with respect to the generally used whole frequency bands. Accordingly, the multi-ary sampling method can be used for detecting the envelope detection of the signal in the ultrasonic image apparatus.

While only certain embodiments of the invention have been specifically described herein, it will apparent that numerous modifications may be made thereto without departing from the spirit and scope of the invention.

What is claimed is:

1. A signal demodulation method using a multi-ary sampling comprising the steps of:

(a) producing an first phase signal and at least two second phase signals adjacent to the first phase signal by sampling an input signal at a sampling point of time having a sampling period of the input signal and other sampling points of time having a sampling interval smaller than the sampling period of the input signal; and (b) generating a corresponding second phase signal in which the second phase signals produced in the step (a) are received for reducing an error due to a difference between the sampling point of time of the first phase signal and the sampling points of time of the second phase signals.

2. A signal demodulation method according to claim 1, wherein said step (a) comprises the steps of:

generating a sampling signal for obtaining the in-phase signal and the at least two quadrature signals having the smallest phase difference from the in-phase signal among the quadrature signals being $\pm(90°+180°\cdot l)$ of which the phase difference from the in-phase signal is varied by an integer l; and generating the first phase signal of in-phase and the second phase signal of quadrature by sampling the input signal according to the generated sampling signal.

3. A signal demodulation method according to claim 1, wherein said step (a) comprises the steps of:

generating a sampling signal for obtaining the quadrature signal and the at least two in-phase signals having the smallest phase difference from the quadrature signal among the in-phase signals being $\pm(90°+180°\cdot l)$ of which the phase difference from the quadrature signal is varied by an integer l; and generating the first phase signal of quadrature and the second phase signal of in-phase by sampling the input signal according to the generated sampling signal.

4. A signal demodulation method according to claim 1, wherein said step (b) produces the corresponding second phase signal by interpolating the at least two second phase signals.

5. A signal demodulation method according to claim 1, further comprising the step of detecting an envelope signal of the input signal using the first phase signal and the corresponding second phase signal.

6. A signal demodulation method using a multi-ary sampling comprising:

a first step for producing an in-phase signal and at least two quadrature signals adjacent to the in-phase signal by sampling each input signal input via a plurality of channels at a sampling point of time having a sampling period of the input signal and other sampling points of time having a sampling interval smaller than the sampling period of the input signal, the sampling period of the input signal being set each channel;

a second step for generating a corresponding quadrature signal for each channel in which an error due to a difference between the sampling point of time of the in-phase signal and the sampling points of time of the quadrature signal is reduced from the quadrature signals produced in the first step;

a third step for producing an accumulated in-phase signal and an accumulated corresponding quadrature signal by accumulating the in-phase signal and the corresponding quadrature signals produced in the second step by a same phase signal; and a fourth step for detecting an envelope signal for beam formation of the input signal by receiving the accumulated in-phase signal and the accumulated corresponding quadrature signal.

7. A signal demodulation method according to claim 6, wherein said first step comprises the steps of:

a fifth step for generating a sampling signal for obtaining the in-phase signal and the at least two quadrature signals having the smallest phase difference from the in-phase signal among the quadrature signals being $\pm(90°+180°\cdot l)$ of which the phase difference from the in-phase signal is varied by an integer l; and a sixth step for generating the in-phase signal and the quadrature signals by sampling the input signal to the corresponding channel according to the generated sampling signal.

8. A signal demodulation method according to claim 6, wherein said second step produces the corresponding quadrature signal by interpolating the at least two quadrature signals.

9. A signal demodulation method using a multi-ary sampling comprising:

a first step for producing a first in-phase signal and at least two first quadrature signals adjacent to the first in-phase signal by sampling each input signal input via a plurality of channels at a sampling point of time having a sampling period of the input signal and other sampling points of time having a sampling interval smaller than the sampling period of the input signal, the sampling period of the input signal being set each channel;

a second step for producing a second in-phase signal and second quadrature signals by receiving and accumulating the first in-phase signal and the first quadrature signals produced in the first step by accumulating a mutually related phase signal according to an order produced in the first step;

a third step for for producing a third quadrature signal in which the second quadrature signals produced in the second step are received and an error due to a difference between the sampling point of time of the first in-phase signal and the sampling points of time of the first quadrature signal is reduced in each channel of the first step; and a fourth step for detecting an envelope signal for beam formation by receiving the second in-phase signal and the third quadrature signal.

10. A signal demodulation method according to claim 9, wherein said first step comprises the steps of:

a fifth step for generating a sampling signal for obtaining the first in-phase signal and the at least two first quadrature signals having the smallest phase difference from the first in-phase signal among the first quadrature signals being $\pm(90°+180°\cdot l)$ of which the phase difference from the first in-phase signal is varied by an integer l; and a sixth step for generating the first in-phase signal and the first quadrature signals by sampling the input signal of the corresponding channel according to the generated sampling signal.

11. A signal demodulation method according to claim 9, wherein said third step produces the third quadrature signal by interpolating the at least two second quadrature signals.

12. A signal demodulation apparatus using a multi-ary sampling for beam formation of an input signal comprising:

first means for producing a first in-phase signal and at least two first quadrature signals adjacent to the first in-phase signal by sampling each input signal input via a plurality of channels at a sampling point of time having a sampling period of the input signal and other sampling points of time having a sampling interval smaller than the sampling period of the input signal, the sampling period of the input signal being set each channel;

second means for producing a second in-phase signal and a second quadrature signal accumulated with respect to all the channels by receiving the first in-phase signals and the first quadrature signals produced in the first means and reducing an error due to a difference between the sampling point of time of the first in-phase signal and the sampling points of time of the first quadrature signals; and third means for detecting an envelope signal for beam formation of the received signal by receiving the second in-phase signal and the second quadrature signal produced in the second means.

13. A signal demodulation apparatus according to claim 12, wherein said first means comprises:

a plurality of analog-to-digital converters for generating the first in-phase signal and the first quadrature signals by sampling the input signals of each channel according to a sampling signal of each channel for obtaining the first in-phase signal and the at least two first quadrature signals having the smallest phase difference from the first in-phase signal among the first quadrature signals being $\pm(90°+180°\cdot l)$ of which the phase difference from the first in-phase signal is varied by an integer l.

14. A signal demodulation apparatus according to claim 13, wherein each of said plurality of analog-to-digital converters samples the input signal according to a first sampling signal of each channel having a sampling interval corresponding to four times a carrier frequency of the input signal and produces the first in-phase signal and the first quadrature signals.

15. A signal demodulation apparatus according to claim 13, wherein each of said plurality of analog-to-digital converters comprises a first analog-to-digital converter for sampling the input signal according to a first sampling clock signal of each channel having a sampling interval corresponding to a carrier frequency of the input signal and producing the first in-phase signal, and a second analog-to-digital converter for sampling the input signal according to a second sampling clock signal of each channel having a sampling interval corresponding to twice a carrier frequency of the input signal and producing the first quadrature signal, wherein a sampling pulse of the second sampling clock signal which is most adjacent to the sampling pulse of the first sampling clock signal is spaced from the sampling pulse of the first sampling clock signal by an interval corresponding to four times the carrier frequency of the input signal.

16. A signal demodulation apparatus according to claim 12, wherein said second means comprises:

a first accumulator for accumulating the first in-phase signals of all the channels produced by said first means and outputting the second in-phase signal according to the accumulation result;

a plurality of first quadrature component calculators for receiving the first quadrature signals of all the channels produced by said first means and producing the third quadrature signal for each channel in which an error due to a difference between the sampling point of time of the first in-phase signal and the sampling points of time of the first quadrature signals is reduced; and a second accumulator for accumulating the third quadrature signals from said first quadrature component calculators and outputting the second quadrature signal according to the accumulation result.

17. A signal demodulation method according to claim 16, wherein each of said plurality of the first quadrature signal component calculators produces the third quadrature signal by interpolating at least the two first quadrature signals.

18. A signal demodulation apparatus according to claim 12, wherein said second means comprises:

an accumulator portion for receiving the first in-phase signals and the first quadrature signals of all the channels produced by said first means, accumulating phase signals which are related to each other by the sampling points of time for beam formation, and outputting the second in-phase signal and fourth quadrature signals according to the accumulation result; and a plurality of second quadrature component calculators for receiving the fourth quadrature signals produced by said accumulator portion and producing the second quadrature signal for each channel in which an error due to a difference between the sampling point of time of the first in-phase signal and the sampling points of time of the first quadrature signal is reduced.

19. A signal demodulation method according to claim 18, wherein each of said plurality of the second quadrature signal component calculators produces the second quadrature signal by interpolating at least the two fourth quadrature signals.

20. A signal demodulation apparatus of an input signal using a ternary sampling comprising:

an analog-to-digital converter for sampling the input signal at a first sampling point of time having a sampling period of the input signal and two second sampling points of time having a sampling interval smaller than the sampling period of the input signal and temporally adjacent to the first sampling point of time;

a first latch for latching the output signal from the analog-to-digital converter according to a sampling signal;

a second latch for latching the output signal of the first latch according to the sampling signal, and which is cleared by a clear signal synchronized at the earliest sampling point of time among the three sampling points of time;

a third latch for latching the output signal of the second latch according to the sampling signal, and which is cleared by the clear signal; and a subtracter which is constructed to receive the output signal of the first latch as an adding input end and the output signal of the third latch as a subtracting input end, wherein the subtracter outputs a latched signal as it is when a first signal and a second signal among three signals generated by the sampling signal are latched in the first latch, and subtracts the output signal of the third latch from the output signal of the first latch when a third signal is latched to the first latch, and divides the signal produced by two according to the subtraction result, to thereby generate a fourth signal.

21. A signal demodulation apparatus according to claim 20, further comprising a first-in-first-out memory coupled to receive the output signal of said subtracter, for storing and outputting the second signal and the fourth signal among the signals output from said subtracter.

* * * * *